US007188294B2

(12) United States Patent
Murillo (10) Patent No.: US 7,188,294 B2
(45) Date of Patent: Mar. 6, 2007

(54) HIGH-EFFICIENCY ERROR DETECTION AND/OR CORRECTION CODE

(75) Inventor: Laurent Murillo, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 303 days.

(21) Appl. No.: 10/264,273

(22) Filed: Oct. 3, 2002

(65) Prior Publication Data

US 2003/0070130 A1    Apr. 10, 2003

(30) Foreign Application Priority Data

Oct. 5, 2001  (FR) .................................. 01 12863

(51) Int. Cl.
*H03M 13/00* (2006.01)
*G06F 11/00* (2006.01)

(52) U.S. Cl. ........................ 714/752; 714/785; 714/804
(58) Field of Classification Search ................ 714/752, 714/785, 758, 755, 800, 804, 801
See application file for complete search history.

(56) References Cited

U.S. PATENT DOCUMENTS 3,868,632 A * 2/1975 Hong et al. .................. 714/755
4,888,774 A   12/1989 Kosuge et al.
4,939,733 A * 7/1990 Furutani ...................... 714/765
5,115,436 A * 5/1992 McAuley ..................... 714/781
5,751,744 A   5/1998 Babb
6,219,817 B1 * 4/2001 Holman ....................... 714/785
6,691,278 B1 * 2/2004 Patapoutian et al. ........ 714/801
2003/0070135 A1 * 4/2003 Murillo ....................... 714/785

OTHER PUBLICATIONS

French Search Report from French Patent Application No. 01/12863, filed Oct. 5, 2001.
Glick E. W. et al. "Single Error Correction, Double Error Detection Code Utilizing Minimum Circuitry" IBM Technical Disclosure Bulletin, IBM Corp., New York, US, Vol. 15, No. 1, Jun. 1972, pp. 130-134.
European Search Report from corresponding European Application No. 02354151.
MacWilliams F.J. and Sloan N.J.A.: *The Theory of Error-Correcting Codes*, 1977, North Holland Publishing Company, Amsterdam XP002226718, pp. 23-29.

* cited by examiner

*Primary Examiner*—Phung My Chung
(74) *Attorney, Agent, or Firm*—Lisa K. Jorgenson; William R. McClellan; Wolf, Greenfield & Sacks, P.C.

(57) ABSTRACT

A method for determining r error detection bits of a word of m bits to be coded, including the step of calculating the product of a vector with m components representative of the word of m bits to be coded and of a parity control matrix. The parity control matrix includes at least two consecutive complementary columns. The present invention also relates to a method for determining a syndrome, as well as a coding and decoding circuit.

10 Claims, 8 Drawing Sheets

$$H = \begin{pmatrix} 0 & 0 & 0 & 0 & 0 & 0 & 0 & 0 & 0 & 0 & 0 & 1 & 1 & 1 & 1 & 1 \\ 0 & 0 & 0 & 0 & 1 & 1 & 1 & 1 & 1 & 1 & 1 & 0 & 0 & 0 & 0 & 0 \\ 0 & 1 & 1 & 1 & 0 & 0 & 0 & 1 & 1 & 1 & 1 & 0 & 0 & 0 & 1 & 1 \\ 1 & 0 & 1 & 1 & 0 & 1 & 1 & 0 & 0 & 1 & 1 & 0 & 1 & 1 & 0 & 0 \\ 1 & 1 & 0 & 1 & 1 & 0 & 1 & 0 & 1 & 0 & 1 & 1 & 0 & 1 & 0 & 1 \end{pmatrix}$$

FIG. 1A
(Prior Art)

$$\begin{pmatrix} c_0 \\ c_1 \\ c_2 \\ c_3 \\ c_4 \end{pmatrix} = H * \begin{pmatrix} x_0 \\ x_1 \\ \vdots \\ x_{15} \end{pmatrix}$$

FIG. 1B
(Prior Art)

$$H' = \begin{bmatrix}
1 & 0 & 0 & 0 & 0 & 1 & 1 & 1 & 0 & 0 & 0 & 1 & 1 & 0 & 1 \\
1 & 0 & 0 & 0 & 1 & 1 & 1 & 0 & 0 & 0 & 1 & 1 & 0 & 1 & 0 \\
1 & 0 & 0 & 1 & 1 & 1 & 0 & 0 & 0 & 1 & 1 & 0 & 1 & 0 & 1 \\
1 & 0 & 1 & 1 & 1 & 0 & 0 & 0 & 1 & 1 & 0 & 1 & 0 & 1 & 0 \\
1 & 1 & 1 & 1 & 0 & 0 & 0 & 1 & 1 & 0 & 1 & 0 & 1 & 0 & 1
\end{bmatrix}$$

$$H = \begin{bmatrix}
1 & 0 & 0 & 0 & 0 \\
0 & 1 & 0 & 0 & 0 \\
0 & 0 & 1 & 0 & 0 \\
0 & 0 & 0 & 1 & 0 \\
0 & 0 & 0 & 0 & 1 \\
H'
\end{bmatrix}$$

FIG. 2A
(Prior Art)

$$S = \begin{pmatrix} S_0 & S_1 & S_2 & S_3 & S_4 \end{pmatrix} = H' * \begin{pmatrix} X_r \\ C_r \end{pmatrix}$$

HIGH-EFFICIENCY ERROR DETECTION AND/OR CORRECTION CODE

BACKGROUND OF THE INVENTION

1. Field of the Invention

The present invention relates to error detection and/or correction codes.

Error detection codes have a technical effect and solve a significant technical problem. Indeed, they enable restoring the value of one or several erroneous bits, for example, after a storage or a transmission. Without such codes, any storage or transmission of digital data would be difficult.

The present invention relates in particular to linear codes of Hamming type.

2. Discussion of the Related Art

The Hamming code is an error detection and correction code used in many fields. A first example of a Hamming code and its use for the data storage in a memory will be described, in the case where the data to be stored are in the form of 16-bit words.

Let X be the word to be stored. X may be represented by a vector $X_e$, the 16 components $X_0$ to $X_{15}$ of which correspond to the 16 bits of the word to be stored. Five error detection bits $C_1$ ($C_0 \ldots C_4$) are obtained by multiplying a parity control matrix H, called a Hamming matrix, of dimensions 5×16, by vector $X_e$ in the form of a column vector.

Figure 1A:
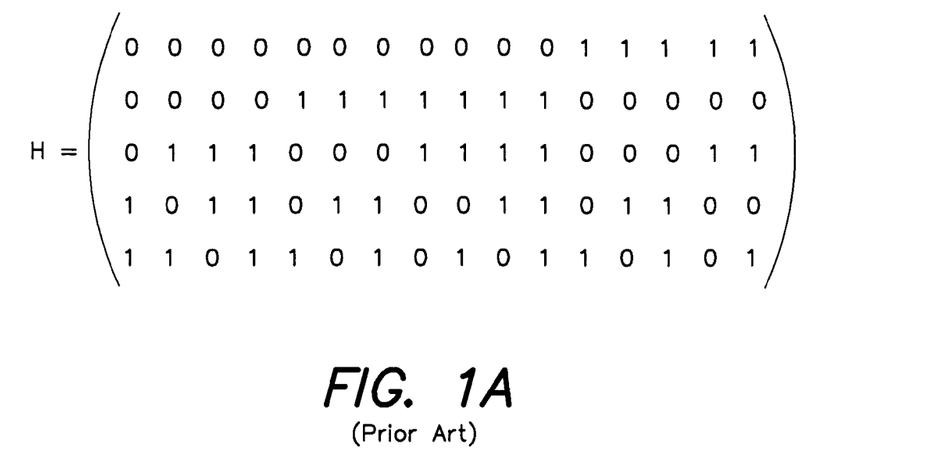
FIGS. 1A and 1B, previously described, respectively show a Hamming matrix H and the way to obtain detection bits to code a 16-bit word.
Figure 1B:
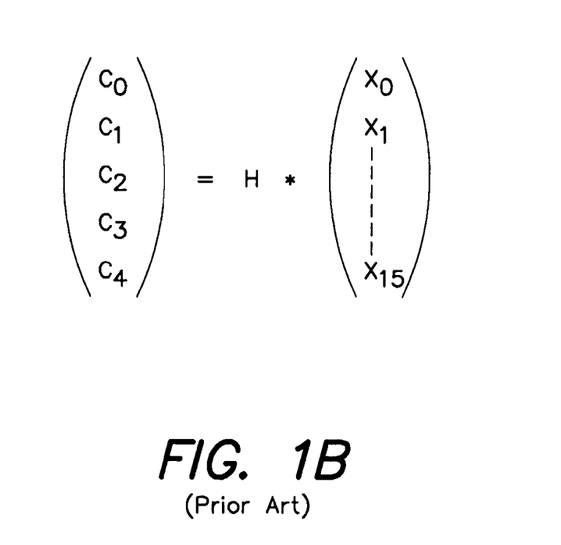

FIG. 1A illustrates Hamming matrix H for 16 bits and FIG. 1B illustrates the way to obtain the detection bits. Calling $h_{ij}$ the elements of matrix H, the error detection bits $C_1$ are given by:

$$C_i = \sum_{j=0}^{15} h_{ij} \cdot X_j$$

$X_j$ being the j-th component of vector $X_e$.

In write mode, 21-bit words, formed of the 16 data bits $X_j$ and of the 5 detection bits $C_1$, are written into the memory. In read mode, the read word includes 16 bits $X_r$ corresponding to the data bits and 5 bits $C_r$ corresponding to the detection bits. It is possible for $X_r$ and $C_r$ not to be equal to $X_j$ and $C_i$ if errors have occurred between the write and read operations.

To detect and/or correct possible errors on the read bits, a syndrome S with five components $S_0, \ldots S4$ is calculated by multiplying a determined matrix H' of dimensions 5×21 by a column vector with 21 components, including the 16 bits $X_r$ and the 5 bits Cr.

Figure 2A:
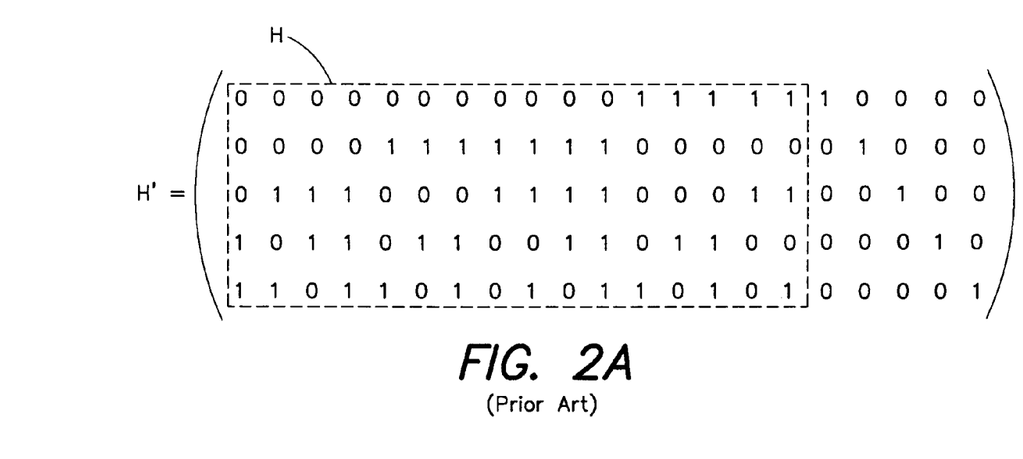
FIGS. 2A and 2B, previously described, respectively show a Hamming matrix H' for calculating a syndrome and the syndrome calculation mode for a 16-bit word.

FIG. 2A illustrates matrix H'. The first 16 columns of matrix H' correspond to the 16 columns of matrix H. The 5 following columns each include a single "1". The 17-th column has its "1" on the first line, the 18-th column has its "1" on the second line, and so on until the 21rst column, which has its "1" on the fifth line. The last five columns of matrix H' are used to determine possible errors in the detection bits.

Figure 2B:
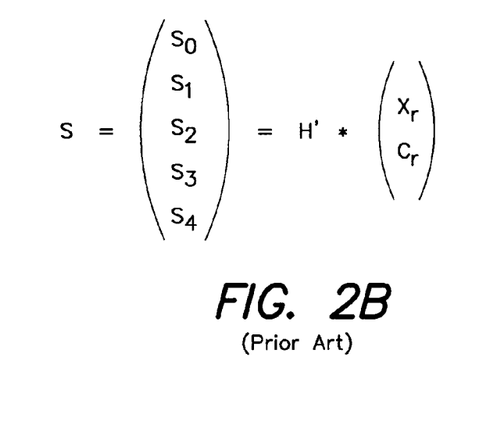

FIG. 2B illustrates the calculation of syndrome S.

If syndrome S has all its components equal to 0, the storage occurs with no error and all the bits of the read word, be they data bits or detection bits, are correct.

If S is different from 0, the read word includes one or several errors. If a single bit of the read word is erroneous, the obtained syndrome enables correcting the error. Indeed, the syndrome corresponds in this case to the column having had its elements multiplied by the erroneous bit. Thus, if the calculated syndrome is equal to:

$$S = \begin{pmatrix} 0 \\ 0 \\ 0 \\ 1 \\ 1 \end{pmatrix},$$

the components (00011) of the syndrome correspond to the elements of the first column of the Hamming matrix, which means that the first bit, $X_0$, is erroneous.

Similarly, if the calculated syndrome is equal to:

$$S'' = \begin{pmatrix} 1 \\ 0 \\ 0 \\ 0 \\ 0 \end{pmatrix},$$

and there is a single error in the read word, this means that the first detection bit $C_0$ is erroneous.

Since the above code cannot detect two errors, it is generally transformed by adding to the word to be coded a total parity bit P.

Total parity bit P is calculated by adding modulo 2 all the data bits and all the detection bits. The total parity bit is added to the word to be stored, and the coded word, that is, the word to be stored, the detection bits, and the total parity bit are altogether stored.

Figure 3A:
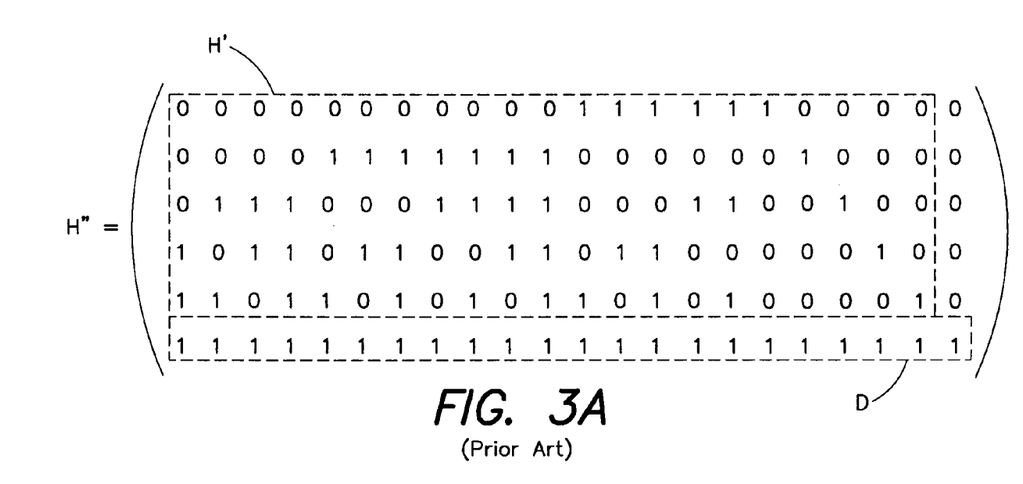
FIGS. 3A and 3B, previously described, respectively illustrate a Hamming matrix H" used in a code enabling detection of two errors for 16-bit words and the corresponding syndrome calculation mode.

In read mode, the read word is multiplied by parity control matrix H" shown in FIG. 3A. Matrix H" has one more line and one more column than matrix H'. Matrix H" includes, to the top left, that is, on the first five lines and on the first 21 columns, a block identical to matrix H'. The last line D of matrix H" only includes "1s" and the last line of matrix H" only includes "0s", except for the last line.

Figure 3B:
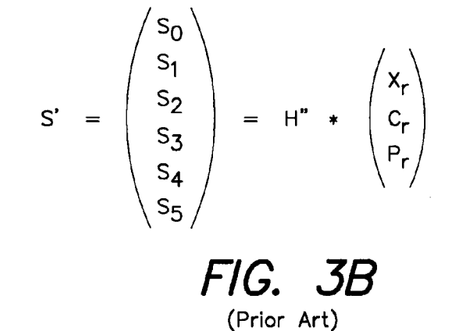

The obtained syndrome S' is illustrated in FIG. 3B. Syndrome S' includes six components $S_0$ to $S_5$, and is obtained by multiplying matrix H" by a column vector including the 22 bits of the read word, comprised of the 16 read data bits $X_r$, followed by the five read detection bits Cr, and by the read total parity bit Pr.

This second code is of the "SEC-DED" type ("Single Error Correction"—"Double Error Detection"). It can detect two errors in all cases, two errors being indicated by the fact that the last component of the syndrome, S5, is zero while the syndrome is different from the zero vector.

The detection bits and the total parity bit are calculated by a coding circuit, and the syndrome components are calculated by a decoding circuit. These circuits include a great number of elementary adders modulo 2. Since each elementary adder requires some time to perform an addition, the results provided by the coding and decoding circuits exhibit a given delay. It is desirable to reduce this delay. Further, prior art adders are relatively small and their realization, which is not optimal, do not enable them to be fast.

SUMMARY OF THE INVENTION

An object of the present invention is to provide an error detection and/or correction code enabling optimization of the elementary calculation units of the coding and decoding circuits.

Another object of the present invention is to provide a method and device for implementing such a code.

Another object of the present invention is to provide an error detection and/or correction code enabling correction of an error and detection of two errors, which is simpler than the corresponding Hamming code.

Another object of the present invention is to provide a method and a device for implementing such an error detection and/or correction code.

To achieve these objects as well as others, the present invention provides a method for determining r error detection bits of a word of m bits to be coded, including the step of calculating the product of a vector with m components representative of the word of m bits to be coded and of a parity control matrix. The parity control matrix includes at least two consecutive complementary columns.

According to an embodiment of the present invention, all columns of said matrix are complementary, except for the first two ones.

According to an embodiment of the present invention, m being even, said matrix is such that:

a) except for the first column, of rank 0, the binary representation of the r−2 first elements of each column of even rank 2$i$ corresponds to rank i of a couple to which the column belongs;

b) the last two elements of each column of even rank 2$i$ are "10", except for the columns of rank 0 and m−2, where they are "01"; and c) the first column of said matrix is formed of r−4 elements equal to "0", followed by elements "1101" and the second column of said matrix, of rank 1, includes "1s" on the r−1 first lines and a "0" on the last line.

According to an embodiment of the present invention, lines and/or columns are permuted.

According to an embodiment of the present invention, number r of the detection bits is equal to n+2, n being the number of bits required to binarily represent number m of bits to be coded.

The present invention also relates to a method for determining a syndrome representative of possible errors having occurred in a processing to an m+r-bit word, the m+r bits corresponding, before processing, to m bits of a word to be coded and r error detection bits obtained by a method defined hereabove applied to the word of m bits to be coded, the syndrome being obtained in a step consisting of multiplying a specific matrix by a vector having m+r components representative of the m+r-bit word. The specific matrix includes:

a) for the columns of rank 0 to m−1, a first block corresponding to the parity control matrix used in the coding;

b) for the r−1 first lines of the columns of rank m to m+r−2, a second square block of dimension r−1, in the form of a diagonal matrix including only "1s" on its main diagonal, c) under the second block, for the last line of the columns of a rank ranging from m to m+r−2, elements which are the complements to two of those of the last line of the second block; and d) a last column only including "0s" on the r−1 first lines and a "1" on the last line.

The present invention also relates to a coding circuit including elementary adders and enabling calculation of detection bits by means of a parity control matrix such as defined hereabove, the distribution of the elementary adders corresponding to the distribution of the "1s" in said matrix.

According to an embodiment of the present invention, the coding circuit includes m inputs, each input being coupled to a column of the circuit and receiving a bit of the word to be coded. Each elementary adder extends over a space substantially corresponding to the distance separating three consecutive columns of the circuit.

The present invention also relates to a decoding circuit including elementary adders and enabling determination of a syndrome by means of a specific matrix such as defined hereabove, the distribution of the elementary adders corresponding to the distribution of the "1s" in said specific matrix.

According to an embodiment of the present invention, the decoding circuit includes m+r inputs, each input being coupled to a circuit column and receiving a bit of the word to be decoded. Each adder extends over a space substantially corresponding to the distance separating three consecutive columns of the circuit, except for the adders of columns m to m+r which include two adjacent adders.

The foregoing objects, features and advantages of the present invention will be discussed in detail in the following non-limiting description of specific embodiments in connection with the accompanying drawings.

DETAILED DESCRIPTION

Figure 4A:
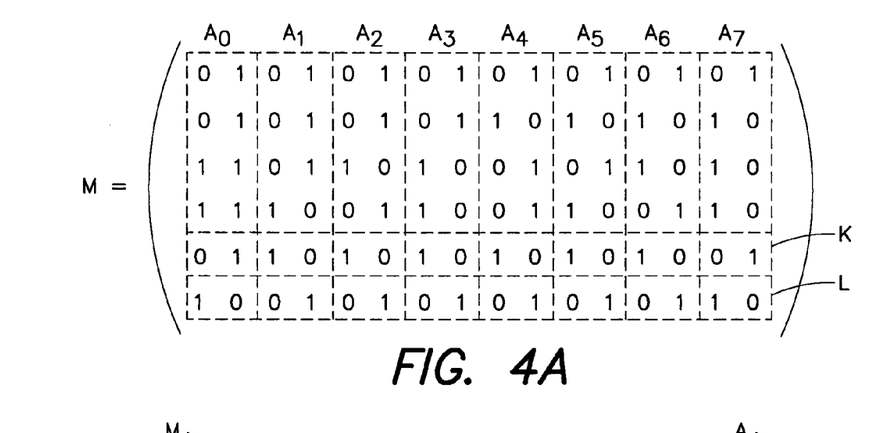
FIG. 4A shows a parity control matrix M according to the present invention for coding a 16-bit word.

FIG. 4A illustrates an example of a parity control matrix M for calculating the detection bits for 16-bit words, in an error correction/detection code according to the present invention. The number of detection bits is equal to 6 and matrix M is a matrix of dimension 6×16. Each column of matrix M is different from another and the columns are linearly independent two by two. Further, each column of matrix M is complementary to an immediately adjacent column, except for the first two columns.

Matrix M can be decomposed in eight couples $A_i$ of two adjacent columns, i ranging from 0 to 7. Couple A0 corresponds to the columns of rank 0 and of rank 1, couple $A_i$ to the columns of rank 2 and of rank 3, etc. In the non-limiting example of matrix M shown in FIG. 4A, the two columns of a couple $A_i$ are complementary, except for couple A0. In FIG. 4A, the couples $A_i$ are formed as follows.

For couples $A_1$ to $A_7$, the first four elements of the first column of a couple correspond to the binary representation of rank i of couple Ai. Thus, the first column of couple $A_3$ has its first four elements equal to "0011", which is the binary representation of number 3.

The first four elements of the first column of couple A0 (column of rank 0) are chosen to be equal to "0011". This choice is not critical. The first four elements of the column of rank 0 may indeed have any value, provided that the column of rank 0 once completed is different from any other column of matrix M or from the columns relative to the detection bits of the matrix used for the decoding, M', which will be described hereafter. The retained choice ("0011") has the advantage of using a small number of "1s", which simplifies the coding and decoding circuits, the number of "1s" corresponding, as will be seen hereafter, to the number of adders in the circuit.

The last two elements of each first column of a couple $A_i$ (columns of even rank) are equal to "10", except for the first and last couples $A_i$ (columns of rank 0 and 14), where they are equal to "01".

Except for the first couple, A0, each second column of a couple $A_i$ is complementary to the first column of the couple. In other words, except for the column of rank 1, the elements of each column of odd rank are the complements to two of the elements of the immediately preceding column of even rank, and vice versa. For example, the elements of the first column of couple A4 are equal to "010010" and the elements of the second column of this couple are "101101". In FIG. 4A, couple A0 has "001101" as its first column and "111110" as its second column.

It should be noted that the penultimate line of matrix M, referred to as K, having as elements "0110101010101001", is complementary to the last line of matrix M, referred to as L, having as elements "1001010101010110". This provides advantages, as will be seen hereafter.

When matrix M is multiplied by a column vector of sixteen components corresponding to the bits of the word to be coded, six detection bits C0–C5 are obtained, which are added to the word to be coded to form a 22-bit coded word.

Figure 4B:
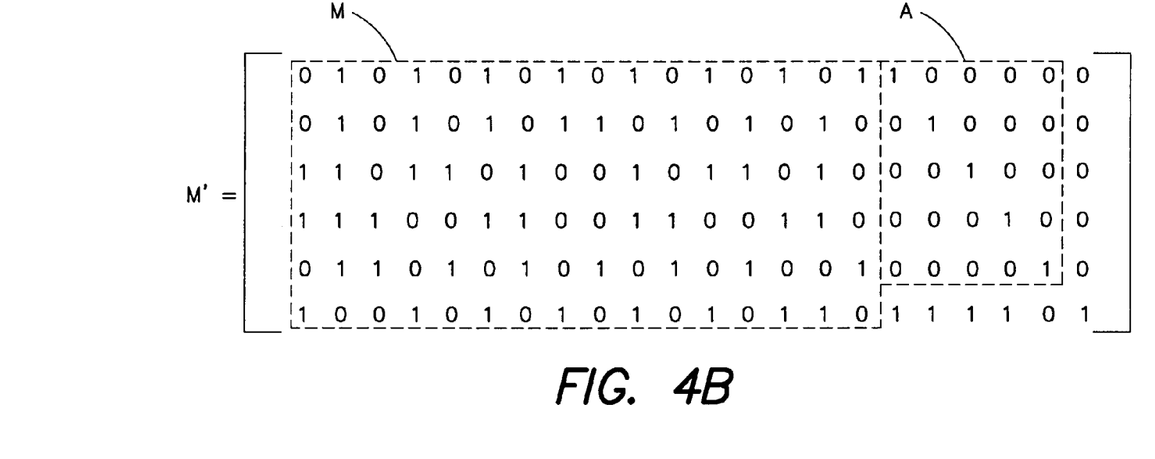
FIG. 4B shows a matrix M' used to calculate a syndrome according to the present invention.

FIG. 4B illustrates matrix M' used for the decoding. At the decoding, a vector having 22 components, corresponding to the 22 bits of the word to be decoded (16 data bits and 6 detection bits after any processing, for example, a storage in a memory or a transmission), is multiplied by matrix M' to form a syndrome having six components $S_0$–$S_5$. Matrix M' is a matrix of dimension 6×22. In matrix M', the first sixteen columns form a block identical to matrix M. The first five lines of the five next columns (ranks 16 to 20) form a block A of dimension 5×5 formed by a diagonal matrix which only includes "1s" on its main diagonal and "0s" elsewhere. Under block A, the elements of the last lines of the columns of rank 16 to 20 are chosen to be equal to "11110", to correspond to the inverses of the elements of the last line of block A ("00001"). The last column of matrix M', which enables correcting an error on the sixth detection bit, includes "0s" on the first five lines and a "1" on the last line.

It should be noted that, in matrix M', the columns corresponding to the data bits are complementary two by two, except for the first two. Further, the last two lines are also complementary. If the sum modulo 2 of the last two syndrome components, S4 and $S_5$, is calculated, the sum modulo 2 of all the data bits and the detection of the word to be decoded, that is, a total parity bit $P_r$, are obtained. Total parity bit $P_r$ is here simply obtained and is substantially calculated in twice as less time as in the case of the corresponding Hamming code. Further, upon coding, conversely to the corresponding Hamming code, no total parity bit P is calculated. Total parity bit $P_r$ is used as follows.

If the syndrome is equal to the zero vector, there are no errors, either in data bits, or in the detection bits.

If the syndrome is different from the zero vector and total parity bit $P_r$ is equal to 1, this means that there has been a single error, which can be corrected. Indeed, the syndrome components, in this case, correspond to the elements of the column of matrix M' corresponding to the erroneous bit.

If the syndrome is different from the zero vector and total parity bit $P_r$ is equal to 0, two errors are present, which are detected.

Figure 5A:
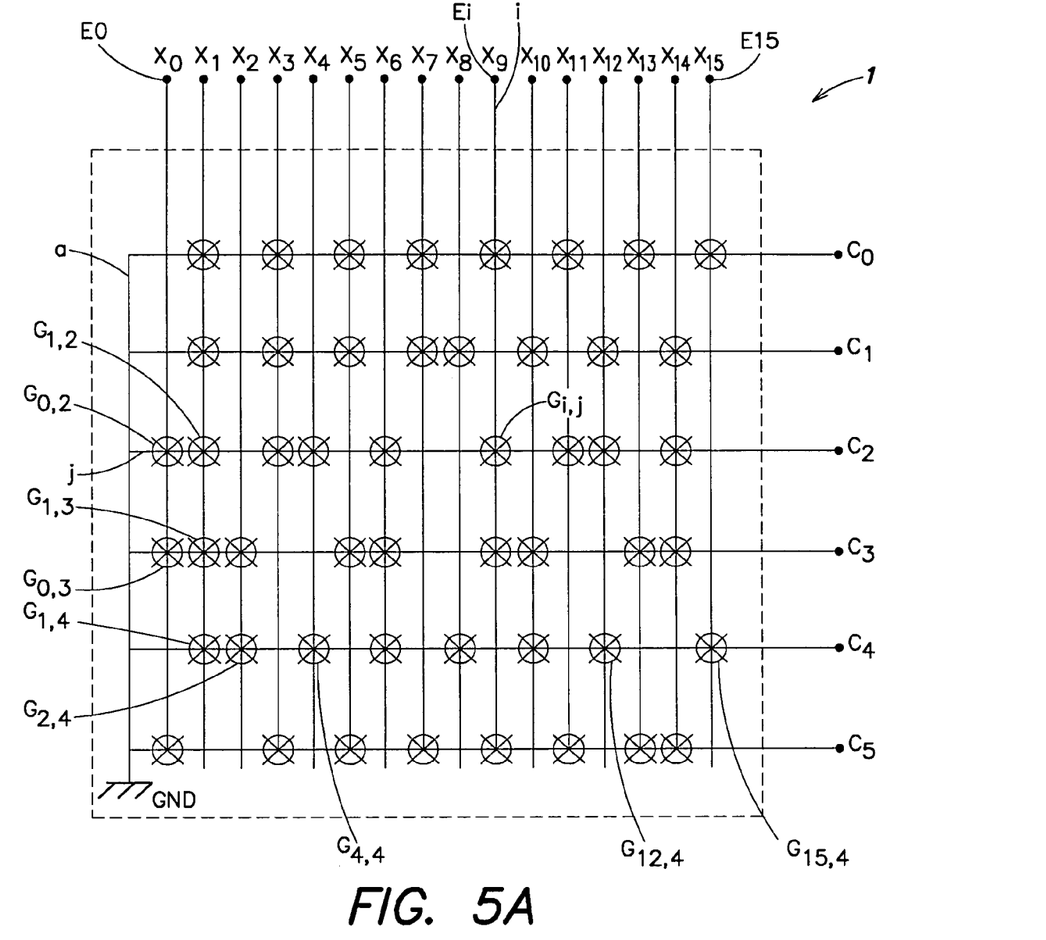
FIG. 5A illustrates the principle of a circuit used for the coding of a word by means of matrix M.

FIG. 5A schematically shows the principle of a circuit used for the coding, enabling calculating the detection bits from the data bits. Coding circuit 1 includes 16 inputs $E_0$ to $E_{15}$, which receive the 16 data bits $X_0$ to $X_{15}$ of the word to be coded. Circuit 1 also includes 6 outputs $C_0$ to $C_5$ providing the six detection bits. Each input $E_i$ is connected to a column of rank i of the circuit. Each output $C_j$ is connected to a line of rank j. An adder modulo 2 $G_{i,j}$ schematically indicated herein by a circle marked with a cross may be present at the intersection of column i and of line j. The adders modulo 2 may be any adders, and formed for example by XOR gates.

Figure 5B:
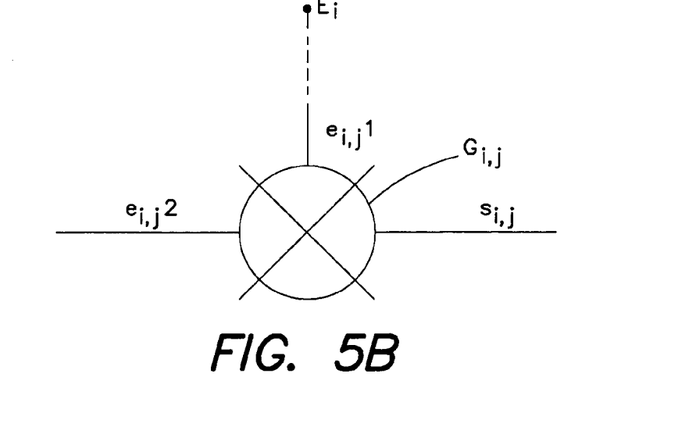
FIG. 5B shows an element of the circuit of FIG. 5A.

As shown in FIG. 5B, adder $G_{i,j}$ includes two inputs $e_{i,j}1$ and $e_{i,j}2$, often respectively called e1 and e2 hereafter, for simplification. Input $e_{i,j}1$ is connected to input $E_i$ and input $e_{i,j}2$ receives the signal present on line j to the left of adder $G_{i,j}$. Adder $G_{i,j}$ also includes an output $s_{i,j}$ located on line j to the right of adder $G_{i,j}$, often more simply called s hereafter.

When there is no adder at the intersection of column i and of line j, column i and line j cross with no influence upon each other. This means that the bit provided to the concerned input is not used to calculate detection bit $C_j$.

An additional column, a, located to the left of the column of rank 0 connects input e2 of each first adder of a line to ground (GND).

The operation of circuit 1 will be explained for the calculation of detection bit $C_4$, corresponding to the line of rank 4. Starting from the left, the first encountered adder is adder $G_{1,4}$. Input e2 of adder $G_{1,4}$ is grounded, via column a, and input e1 of adder $G_{1,4}$ receives data bit $X_1$ via input $E_1$ of the circuit. At the output of adder $G_{1,4}$, $s=0 \oplus X_1$, that is, $X_1$. The signal provided by adder $G_{1,4}$ reaches input e2 of adder $G_{2,4}$, which calculates $X_1 \oplus X_2$. The calculation carries on until reaching adder $G_{15,4}$, which performs the addition modulo 2 of the result provided by adder $G_{12,4}$ and data bit $X_{15}$. Thus:

$$C_4 = X_1 \oplus X_2 \oplus X_4 \oplus X_6 \oplus X_8 \oplus X_{10} \oplus X_{12} \oplus X_{15},$$

which does correspond to the multiplication of the fifth line of matrix M by a vector having as components the bits of the word to be coded. Generally speaking, circuit 1 has the structure of matrix M, the circuit lines and columns corresponding to the lines and columns of matrix M, an adder modulo 2 being located where matrix M includes a "1". In prior art, each adder takes up a space corresponding to the interval between two circuit columns.

The advantage provided by the fact that adjacent columns of matrix M are complementary will now be described.

Indeed, in the present invention, an adder modulo 2 of circuit 1 is not contiguous on both sides to another adder, except, possibly, for the first two columns. As a result, such an adder can laterally occupy the place of two adders and be, for a same surface area of the circuit, twice as large as in prior art. The adder can then be optimally formed, and be much faster.

Figure 5C:
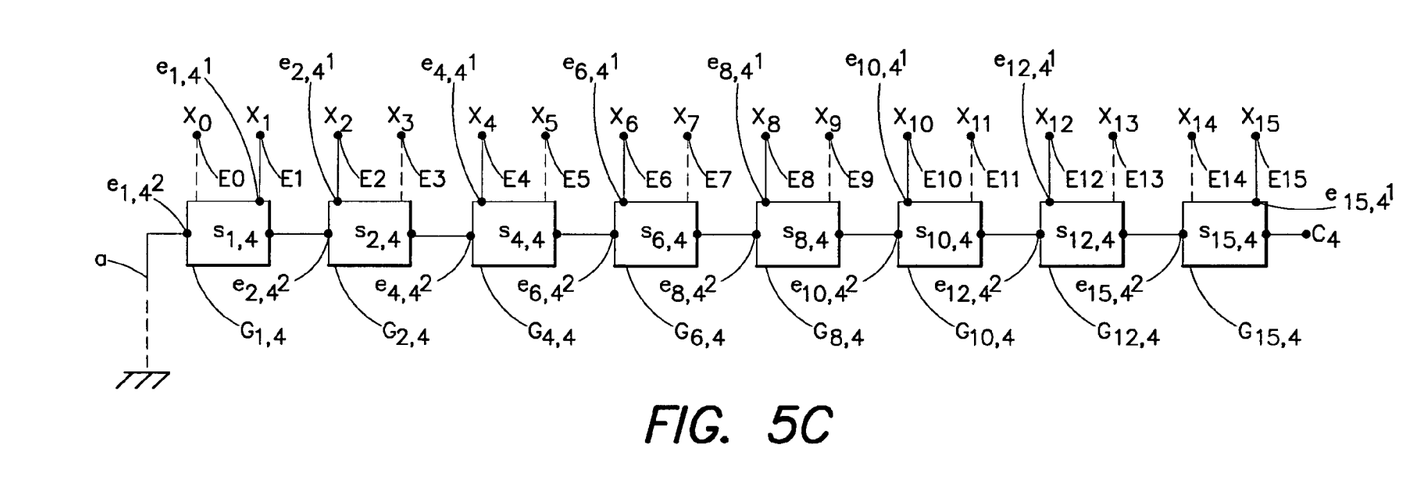
FIG. 5C shows a line of the circuit used for the coding.

FIG. 5C illustrates the line of rank 4 of circuit 1, providing detection bit $C_4$. Each adder $G_{i,j}$ is shown in the form of a rectangular block. The first adder encountered is adder $G_{1,4}$. Its input e2 ($e_{1,4}2$) is grounded via column a. Its input e1 ($e_{1,4}1$) receives bit $X_1$ via input E1. In FIG. 5C, the columns of circuit 1 which are not connected to the input of an adder of the line of rank 4 are shown in dotted lines. Output $s_{i,j}$ of each of the adders supplies input e2 of the next adder or, for the last adder, the circuit output. The line of rank 4 of the coding circuit includes eight adders ($G_{1,4}$, $G_{2,4}$, $G_{4,4}$, $G_{6,4}$, $G_{8,4}$, $G_{10,4}$, $G_{12,4}$, and $G_{15,4}$), the data bits used to calculate detection bit $C_4$ being $X_1$, $X_2$, $X_4$, $X_6$, $X_8$, $X_{10}$, $X_{12}$, and $X_{15}$. All the adders of the line of rank 4 have a double surface area as compared to what is provided in prior art.

Although in FIG. 5C, the input e1 of an adder $G_{i,j}$ is located either to the left, or to the right of the adder, all circuit adders may have the same physical structure. In this case, input e1 is arranged at a same determined location of the adder, a set of vias or connections enabling the desired bit to supply the concerned input.

In matrix M of FIG. 4A, the first two columns are not complementary. However, independently from this, the adders corresponding to the first two columns of circuit 1 may have the same size as the adders of the rest of the circuit. First, a problem is only posed when two consecutive "1s" are present on the first two columns of a same line of the matrix. This only occurs for the lines of rank 2 and 3. Then, it is possible, even in these cases, to use adders having a size twice as large as in prior art.

Consider, for example, the case of the line of rank 3. The first adder in the line, $G_{0,3}$ (FIG. 5A) is followed by adder $G_{1,3}$. Adder $G_{0,3}$ adds modulo 2 bit $X_0$ and 0 (ground voltage). Adder $G_{0,3}$ outputs bit $X_0$. Its function thus only is to transmit the data bit that it receives to the next adder. In the present invention, the two adders $G_{0,3}$ and $G_{1,3}$ are replaced with a single adder, which is not grounded and receives on its two inputs bits $X_0$ and $X_1$.

Figure 5D:
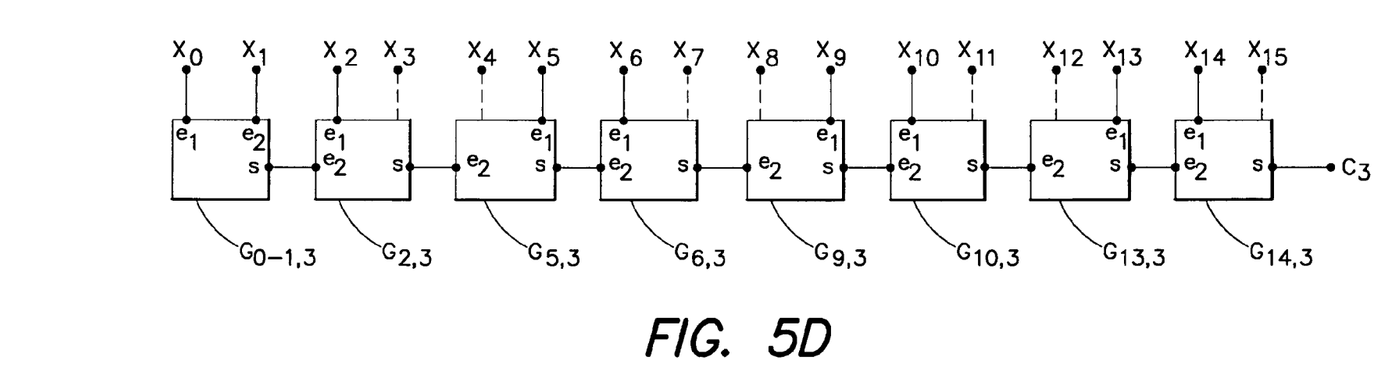
FIG. 5D shows another line of the circuit used for the coding.

Thus, in FIG. 5D, which shows the line of rank 3 of circuit 1, a single adder, referred to as $G_{0-1,3}$ replaces adders $G_{0,3}$ and $G_{1,3}$ of FIG. 5A. Adder $G_{0-1,3}$ has two inputs e1 and e2 respectively receiving data bits $X_0$ and $X_1$. Adder $G_{0-1,3}$ outputs the sum modulo 2 of bits $X_1$ and $X_2$. Adder $G_{0-1,3}$ occupies the surface area of the two adders $G_{0,3}$ and $G_{0,1}$. Adder $G_{0-1,3}$ has the same size as the adders following it, that is, adders $G_{2,3}$, $G_{5,3}$, $G_{6,3}$, $G_{9,3}$, $G_{10,3}$, $G_{13,3}$, and $G_{14,3}$, connected according to the above-discussed principles. The line of rank 3 of the circuit provides detection bit $C_3$, which is the sum modulo 2 of data bits $X_0$, $X_1$, $X_2$, $X_5$, $X_6$, $X_9$, $X_{10}$, $X_{13}$, and $X_{14}$.

The first two adders of the line of rank 2 of FIG. 5A, $G_{0,2}$ and $G_{1,2}$ are similarly replaced with a single adder not shown, $G_{0-1}2$ which is not grounded and receives on its two inputs data bits $X_0$ and $X_1$.

Circuit 1 is thus formed of 48 adders (8 adders per line), all having a same silicon surface area, which is twice that provided by prior art. Each of the adders may have a more careful implementation and, due to the optimal individual performances of each of the adders, the calculation of the detection bits can be much faster.

Further, due to the fact that coding matrix M has two complementary lines, no total parity bit P is ever calculated upon coding. The 6 detection bits $C_0$ to $C_5$ may be calculated in parallel and added to the word to be coded with no additional time loss.

Figure 6:
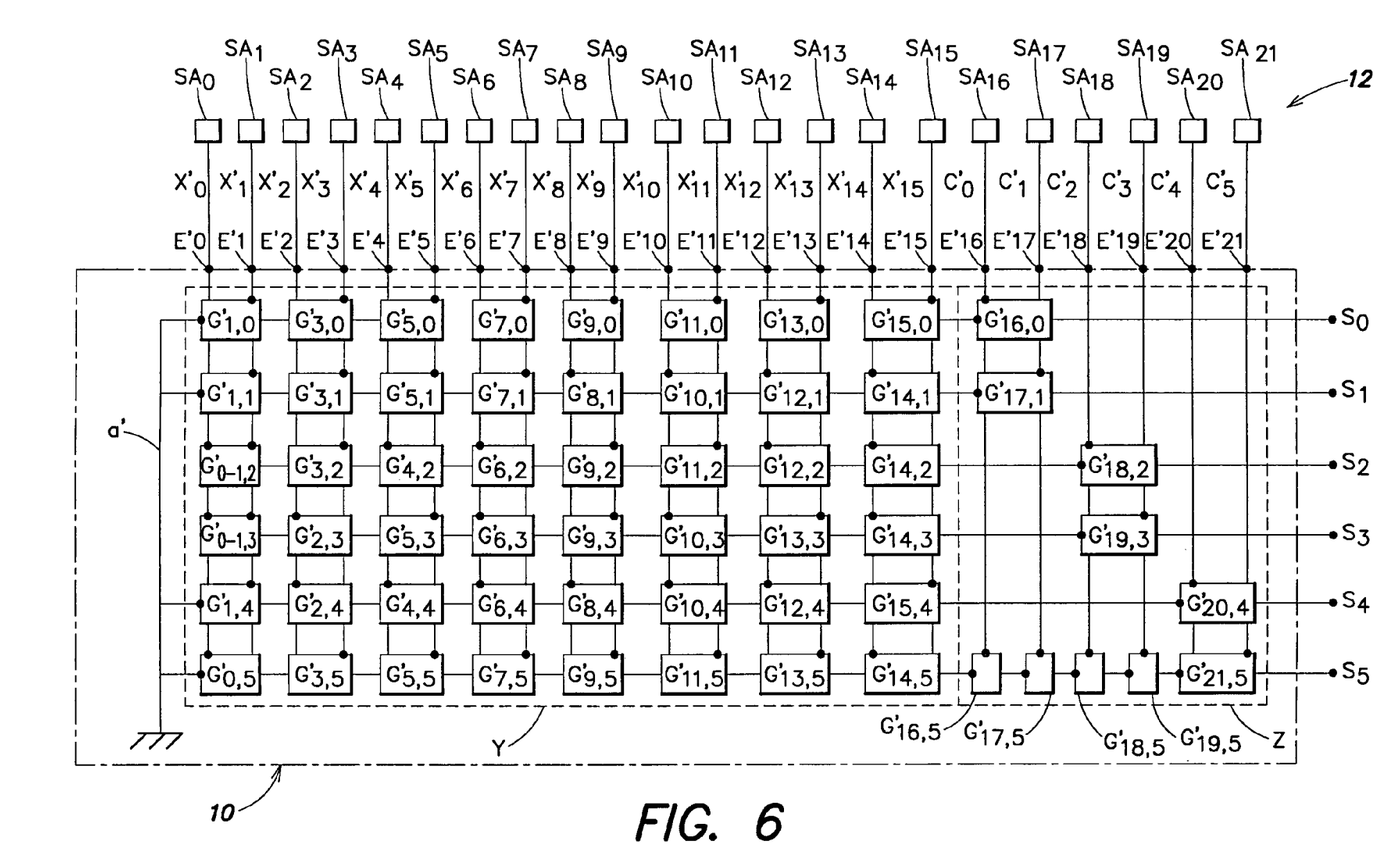
FIG. 6 shows a circuit used to calculate a syndrome.

FIG. 6 schematically shows a circuit 10 used upon decoding. Circuit 10 includes 22 inputs E'0 to E'21 receiving the 22 bits of the word to be decoded (16 data bits $X'_0$ to $X'_{15}$ and 6 detection bits $C'_0$ to $C'_5$). Circuit 10 includes six outputs $S_0$ to $S_5$, each providing a component of the syndrome. Circuit 10 shown herein is directly made at the output of a memory, of which only a line 12 of 22 sense amplifiers $SA_0$ to $SA_{21}$ is shown. Sense amplifiers $SA_i$ are each located at the end of a bit line, not shown (two bit lines for a DRAM), and each provide a bit of the word to be decoded. Sense amplifiers $SA_0$ to $SA_{15}$ provide data bits $X'_0$ to $X'_{15}$ and sense amplifiers $SA_{16}$ to $SA_{21}$ provide detection bits C'0 to C'5. Decoding circuit 10 is formed on the same silicon chip as the memory in which the coded word is stored and may be an integral part thereof. Each of inputs E'i of circuit 10 is spaced apart from another input by the interval separating two sense amplifiers SAi.

Circuit 10 first includes, connected to inputs E'0 to E'15, a block Y formed of a regular paving of six lines of eight adders $G'_{i,j}$ each. The structure of block Y is the structure of coding circuit 1, the first 16 columns of matrix M' corresponding to matrix M. Adders $G'_{i,j}$ of block Y are connected in the same way as previously described in relation with FIGS. 5A to 5D. An image of circuit 1 can besides be obtained by referring to block Y, replacing the elements marked with a "prime" with elements with no "prime".

Adders $G'_{1,0}$, $G'_{1,1}$, $G'_{1,4}$ and $G'_{0,5}$, respectively corresponding to the first adders of the lines of rank 0, 1, 4, and 5, have an input connected to a ground line a' and an input connected, according to cases, to data bit $X_0$ or $X_1$. The first adders of the lines of rank 2 and 3, $G'_{0-1,2}$ and $G'_{0-1,3}$, receive as an input the two data bits $X_0$ and $X_1$. The other adders of block Y, corresponding to the columns of rank 2 to 15, include an input connected to the output of the immediately preceding adder and another input connected to one of the two inputs E'i likely to supply the adder.

In addition to block Y, circuit 10 includes a block Z of ten adders connected to inputs E'16 to E'21, in charge of carrying out the mathematical operations on the data bits. On the line of rank 0 of block Z, there is a single adder, $G'_{16,0}$, which receives the output of adder $G'_{15,0}$ on one input, and detection bit $C'_0$ on another input. The output of adder $G'_{16,0}$ supplies output $S_0$ of the circuit. Adder $G'_{16,0}$ may occupy, if desired, a space extending over six columns of circuit 10 (sense amplifiers $SA_{16}$ to $SA_{21}$). However, for practical reasons, adder $G'_{16,0}$ is of the same type as adders $G'_{i,j}$ of block Y and takes up a surface area which is double that provided in prior art.

The line of rank 1 of block Z also includes a single adder $G'_{17,1}$, of same surface area as adder $G'_{16,0}$, receiving on its two inputs the output of adders $G'_{14,1}$ and detection bit $C'_1$. The output of adder $G'_{17,1}$ supplies output $S_1$ of circuit 10.

Line 2 of block Z includes an adder $G'_{18,2}$ of same size as adder $G'_{16,0}$ or $G'_{17,1}$, receiving on an input the output of adder $G'_{14,2}$ and on its other input detection bit $C'_2$. Adder $G'_{18,2}$ supplies output $S_2$ of the circuit.

On the next lines of block Z is adder $G'_{19,3}$, of same size as adder $G'_{18,2}$, receiving as an input the output of adder $G'_{14,3}$ and detection bit $C'_3$. Adder $G'_{19,3}$ supplies output $S_3$ of circuit 10.

The line of rank 4 of block Z includes an adder $G'_{20,4}$, receiving the output of adder $G'_{15,4}$ and detection bit $C'_4$. Adder $G'_{20,4}$ supplies output $S_4$ of circuit 10.

The last line of block Z, of rank 5, includes five adders which cannot each use a double circuit surface area. Indeed, on this line, adder $G'_{14,5}$ of block Y supplies an adder $G'_{16,5}$ followed, in this order, by adders $G'_{17,5}$, $G'_{18,5}$, $G'_{19,5}$, and $G'_{21,5}$. Adder $G'_{21,5}$ supplies output $S_5$ of circuit 10. Adders $G'_{16,5}$, $G'_{17,5}$, $G'_{18,5}$, and $G'_{19,5}$, which respectively receive detection bits $C'_0$, $C'_1$, $C'_2$, and $C'_3$, cannot be wider than the interval separating two circuit columns. Their width thus cannot be greater than that of a sense amplifier. Adder $G'_{21,5}$, however, receiving the output of amplifier $G'_{19,5}$ and detection bit $C'_5$, may be as wide as two sense amplifiers and of a size similar to that of the adders of block Y.

The examination of FIG. 6 shows that almost all adders of the decoding circuit occupy a surface area which is double that provided in prior art. Adders of double surface area can be much faster than adders having half their surface area and thereby, the decoding circuit is much faster than in prior art.

It should further be noted that, as much as concerns the coding circuit as the decoding circuit, the number of adders per line is reduced as compared to prior art. This results in an additional time gain. As a comparison, reference will be made to the last line of matrix H" of prior art (FIG. 3A), formed of 22 consecutive "1s". Thus, the last line of the corresponding decoding circuit includes 22 small adders in series. In the present invention, with matrix M', the last line of the decoding circuit only includes 13 adders, 9 of which have a surface area which is double that of prior art. The time gain thus is present at two levels. Indeed, in the present invention, not only are all adders more bulky and thus faster, but also is their number per line smaller. Since the general calculation time corresponds to the sum of the processing times in each of the adders, the circuit according to the present invention is much faster and with much higher performances than the circuit of prior art. Further, the more careful implementation of the adders of larger surface area enables them to be more reliable.

Of course, the code of the present invention is not limited to codes intended for 16-bit words. Indeed, it is possible, provided that at least two consecutive columns are complementary, which enables reducing the processing time of the adders concerned by these columns, to define codes enabling coding words having any number of bits.

For example, it is possible to generalize matrix M of FIG. 4A to code any even number m of bits. Number r of detection bits must be at least greater by 2 than the number necessary to binarily represent the number of bits of the word to be coded. Preferably, r will be equal to its minimum value, to avoid making the code too heavy. Thus, when m is equal to 16, four bits are required to binarily represent sixteen possibilities and r is chosen to be equal to 6, as seen previously. For m=32, the number of detection bits is chosen to be equal to 7, 32 being equal to 25. For m=128, 9 detection bits are required, and so on.

To generalize matrix M, number r of necessary detection bits is first determined. Then, matrix Mm used for the coding is built, so that the first r–2 elements of each column of even rank indicate, except for the first column, the rank of the couple to which the column belongs (a couple Ai, of rank i, is formed of the column of even rank 2i and of the column of odd rank 2i+1; the rank of the first column is 0, and that of the last columns is m–1). The last two elements of the columns of even rank are equal to "10", except for the column of rank 0 and the column of rank m–2, where they are "01".

The first column of matrix Mm may be formed of r–4 elements equal to "0", followed by elements "1101". The second column of matrix Mm, of rank 1, may be formed of r–4 elements equal to "1", followed by elements "1110". The columns of odd rank, except for the column of rank 1, are complementary to the immediately preceding column of even rank.

It should be noted that the last line of matrix Mm is complementary to its penultimate line.

It should also be noted that the first r–2 elements of the first column of matrix Mm may be identical to the r–2 elements of any column of matrix Mm, at the following conditions: that the first column is different from all other columns of matrix Mm; the first four elements of the first column must not be all "0s" and must include more than one "1", so that the column is different from the columns of the matrix used upon decoding, which correspond to the detection bits.

To form matrix M'm used for the decoding, parity control matrix Mm is first taken, and completed to the right by a square sub-matrix R of dimension r×r. Sub-matrix R includes "1s" on its main diagonal, and "0" everywhere else except on its last line, the elements of which are the inverses of those of the penultimate line of sub-matrix R. The last line of sub-matrix R thus includes "1s" everywhere except at the penultimate column.

The code using matrixes Mm and M'm has a minimum code distance equal to four. It enables correcting one error and detecting two errors. Upon decoding, the obtained syndrome has r components. A total parity bit is obtained by adding modulo 2 the last two syndrome components.

If the syndrome is the zero vector, there is no error. If the syndrome is different from the zero vector and the total parity bit is equal to "1", there is a single error. This error is easily corrected since the syndrome corresponds to the matrix column having had its elements multiplied by the erroneous bit. If the syndrome is different from the zero vector and the total parity bit is equal to "0", two errors are present.

All adders of the coding circuit and almost all adders of the decoding circuit, respectively calculating the detection bits and the syndrome components by means of matrixes Mm and M'm, may extend over two intervals separating two circuit columns and have a surface area which is double that provided by prior art.

Figure 7:
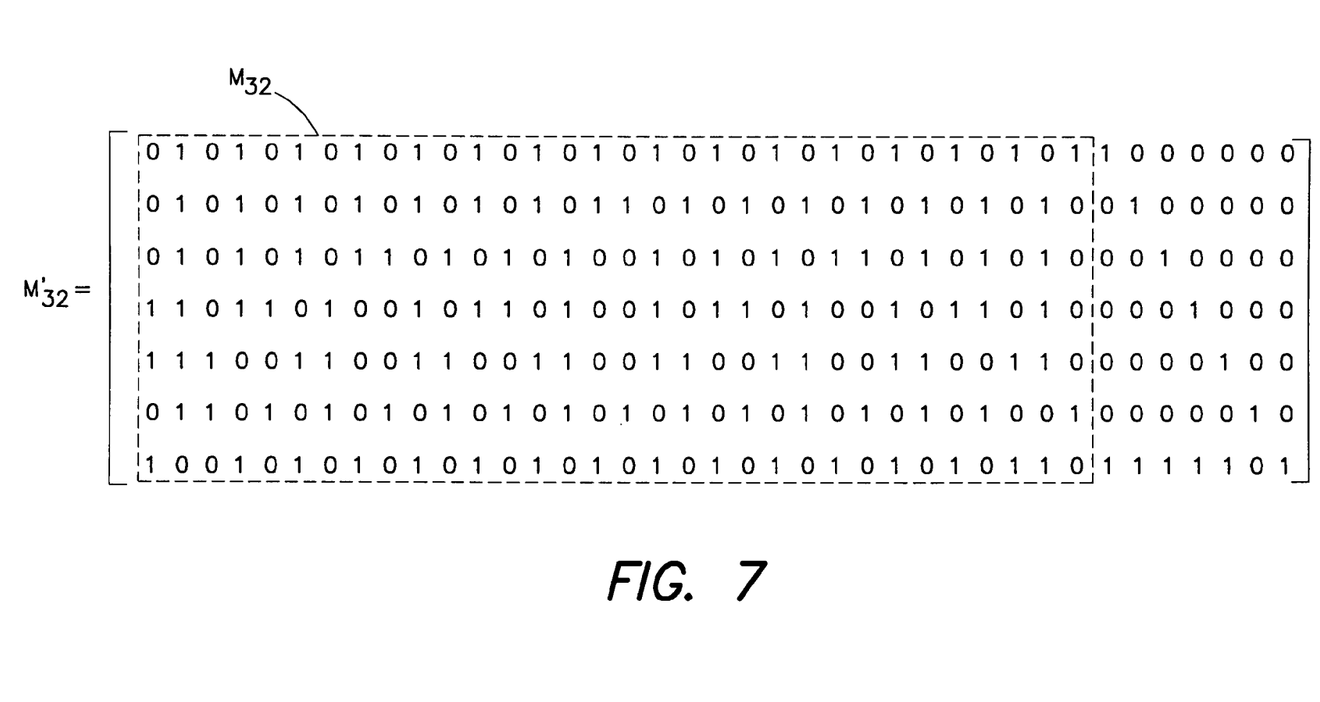
FIG. 7 shows a matrix M'32 according to the present invention used for the decoding of 32-bit words.

FIG. 7, as an example, illustrates a matrix M'32 used to decode 32-bit words. Matrix M'32 has dimension 7×39. Its 32 first columns correspond to matrix M32 used upon coding. Matrixes M32 and M'32 are formed on the model of what has been previously described. The corresponding coding and decoding circuits, not shown, are easily deduced from matrixes M32 and M'32 by means of the principles defined in relation with FIGS. 5A-5D and 6.

Of course, the present invention is likely to have various alterations, modifications, and improvements which will readily occur to those skilled in the art. In particular, any line permutation in a parity control matrix according to the present invention is within the scope of the present invention and changes nothing to the code of the present invention. Any column permutation in a matrix of the present invention is also within the scope of the present invention, provided that at least two consecutive columns remain complementary. Number N of bits of the word to be coded may be even or odd. If number N is odd, a matrix Mm such as described hereabove with an even m equal to N+1 may for example first be formed. Then, matrix $M_N$ to be used upon coding can easily derive from matrix Mm by suppression of any column, for example, the first column.

The present invention has mainly been described in the context of the storage of words in a memory. Of course, the present invention also applies to any coding and decoding of words to which an error detection and/or correction code is desired to be assigned. For example, the present invention applies to transmission.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for determining r error detection bits of a word of m bits that is to be coded, including a step of forming a vector with m components, each component corresponding to a bit of the word that is to be coded, a step of multiplying, by means of a computing circuit, said vector by a parity control matrix, wherein all columns of the parity control matrix except two are complementary in pairs, said multiplying step providing a result, and a step of providing r error detection bits based on said result.

2. The method of claim 1, wherein the two non complementary columns are the first two columns of said matrix.

3. The method of claim 2, wherein, m being an even number, said matrix is such that:
   a) except for a first column, of rank 0, the binary representation of the r−2 first elements of each column of even rank 2$i$ corresponds to rank i of a couple to which the column belongs;
   b) the last two elements of each column of even rank 2$i$ are "10", except for the columns of rank 0 and m−2, where they are "01"; and
   c) the first column of said matrix is formed of r−4 elements equal to "0", followed by elements "1101" and the second column of said matrix, of rank 1, is formed of r−1 elements equal to "1" followed by element "0".

4. The method of claim 1, wherein two or more than two lines and/or columns are permuted.

5. The method of claim 1, wherein number r of the detection bits is equal to n+2, n being the number of bits required to binarily represent number m of bits of the word that is to be coded.

6. A method for determining a syndrome, said method comprising a step of forming a vector with m+r components, each component corresponding to a bit of an m+r-bit word that is to be decoded, the m+r bits of said word that is to be decoded corresponding, before processing, to m bits of a word that is to be coded and r error detection bits obtained by the method of claim 1 applied to the word of m bits that is to be coded, and a step of multiplying, by means of a computing circuit, said vector by a specific matrix, wherein the specific matrix includes:
   a) for the columns of rank 0 to m−1, a first block corresponding to the parity control matrix used in the coding;
   b) for the r−1 first lines of the columns of rank m to m+r−2, a second square block of dimension r−1, in the form of a diagonal matrix including only "1s" on its main diagonal,
   c) under the second block, for the last line of the columns of a rank ranging from m to m+r−2, elements which are the complements to two of those of the last line of the second block; and
   d) a last column only including "0s" on the r−1 first lines and a "1" on the last line.

7. A coding circuit including elementary adders and enabling calculation of detection bits by means of a parity control matrix including columns, all columns of the parity control matrix except two being complementary in pairs, wherein a distribution of the elementary adders corresponds to the distribution of the "1s" in said matrix, wherein said detection bits are r error detection bits of a word of m bits that is to be coded, and wherein said calculation includes forming a vector with m components, each component corresponding to a bit of the word that is to be coded, multiplying said vector by said parity control matrix and providing said r error detection bits based on a result of said multiplication.

8. The circuit of claim 7, including m inputs, each input being coupled to a column of the circuit and receiving a bit of the word that is to be coded, wherein each elementary adder extends over a space substantially corresponding to the distance separating three consecutive columns of the circuit.

9. A decoding circuit including elementary adders and enabling determination of a syndrome by means of a specific matrix including:
   a) for the columns of rank 0 to m−1, a first block corresponding to the parity control matrix used in the coding;
   b) for the r−1 first lines of the columns of rank m to m+r−2, a second square block of dimension r−1, in the form of a diagonal matrix including only "1s" on its main diagonal,
   c) under the second block, for the last line of the columns of a rank ranging from m to m+r−2, elements which are the complements to two of those of the last line of the second block; and
   d) a last column only including "0s" on the r−1 first lines and a "1" on the last line,
   wherein the distribution of the elementary adders corresponds to the distribution of the "1s" in said specific matrix,
   wherein the syndrome is determined by forming a vector with m+r components, each component corresponding to a bit of an m+r-bit word that is to be decoded, the m+r bits of said word that is to be decoded corresponding, before processing, to m bits of a word that is to be coded and r error detection bits obtained by the circuit of claim 7 applied to the word of m bits that is to be coded, by multiplying, by means of a computing circuit, said vector by said specific matrix, a result of said multiplication being the syndrome.

10. The circuit of claim 9, including m+r inputs, each input being coupled to a circuit column and receiving a bit of the word that is to be decoded, wherein each adder extends over a space substantially corresponding to the distance separating three consecutive columns of the circuit, except for the adders of columns m to m+r which include two adjacent adders.

* * * * *